United States Patent
Andreev et al.

(10) Patent No.: US 6,186,676 B1
(45) Date of Patent: Feb. 13, 2001

(54) METHOD AND APPARATUS FOR DETERMINING WIRE ROUTING

(75) Inventors: Alexander E. Andreev, Moskovskaga Oblast (RU); Ivan Pavisic, Cupertino; Ranko Scepanovic, San Jose, both of CA (US)

(73) Assignee: LSI Logic Corporation, Milpitas, CA (US)

(*) Notice: Under 35 U.S.C. 154(b), the term of this patent shall be extended for 0 days.

(21) Appl. No.: 08/906,947

(22) Filed: Aug. 6, 1997

(51) Int. Cl.[7] .................................................... G06F 17/50
(52) U.S. Cl. ............................ 395/500.13; 395/500.14; 395/500.15
(58) Field of Search ............................... 364/488–491; 395/500.13, 500.14, 500.15

(56) References Cited

U.S. PATENT DOCUMENTS

| | | |
|---|---|---|
| 5,491,641 | 2/1996 | Scepanovic et al. . |
| 5,495,419 | 2/1996 | Rostoker et al. . |
| 5,500,804 * | 3/1996 | Honsinger et al. .................. 364/488 |
| 5,568,322 | 10/1996 | Azami et al. . |
| 5,568,636 | 10/1996 | Koford . |
| 5,578,840 | 11/1996 | Scepanovic et al. . |
| 5,615,128 | 3/1997 | Scepanovic et al. . |
| 5,625,563 * | 4/1997 | Rostoker et al. .................... 364/488 |
| 5,636,125 | 6/1997 | Rostoker et al. . |
| 5,636,129 * | 6/1997 | Her ....................................... 364/488 |
| 5,638,293 | 6/1997 | Scepanovic et al. . |
| 5,661,663 | 8/1997 | Scepanovic et al. . |
| 5,682,322 | 10/1997 | Boyle et al. . |
| 5,712,793 | 1/1998 | Scepanovic et al. . |
| 5,742,510 | 4/1998 | Rostoker et al. . |
| 5,745,363 | 4/1998 | Rostoker et al. . |
| 5,808,899 | 9/1998 | Scepanovic et al. . |
| 5,841,664 * | 11/1998 | Cai et al. ............................. 364/490 |

OTHER PUBLICATIONS

Manjit Borah et al, [An Edge–Based Heuristic for Steiner Routing], Dec. 1994, IEEE 0278–0070/94 $04.00, pp. 198–203.*

Manjit Borah et al., [Fast Algorithm for Performance–Oriented Steiner Routing], 1995, IEEE 1066–1395/95, pp. 1563–1568.*

* cited by examiner

Primary Examiner—Kevin J. Teska
Assistant Examiner—Lonnie A. Knox
(74) Attorney, Agent, or Firm—Mitchell, Silberberg & Knupp LLP

(57) ABSTRACT

Integrated circuit chips (IC's) require proper placement of many cells (groups of circuit components) and complex routing of wires to connect the pins of the cells. Because of the large number of the cells and the complex connections required, it is essential that wire routine be done correctly to avoid any congestion of wires. Congestion of wires can be determined by actually routing of the wires to connect the cells; however, the routing process is computationally expensive. For determination of congestion, the only required information are the location of the connections, or edges, to connect the pins of the IC. The present invention discloses a method to quickly provide a good estimate of the location of the edges, or connections for an IC. The present invention provides for a method to determine all the edges and superedges (bounding boxes, or areas where an edge will take space) of an IC without requiring to determine the actual routing of the wires of an IC.

18 Claims, 3 Drawing Sheets

METHOD AND APPARATUS FOR DETERMINING WIRE ROUTING

BACKGROUND OF THE INVENTION

1. Field of the Invention

The present invention generally relates to the art of microelectronic integrated circuits. In particular, the present invention relates to the art of estimating wire routing on integrated circuit chips.

2. Description of Related Art

An integrated circuit chip (hereafter referred to as an "IC" or a "chip") comprises of cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins, which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

FIG. 1 shows a common organization of an IC. On a semiconductor substrate 10, vertical strips of alternating columns 12 and channels 14 are defined. The cells 16 are fabricated in the columns, and the channels are typically used for running vertical wires to connect the pins 18 of the cells 16. For illustrative purposes, only one wire is shown in FIG. 1. In IC fabrication technology, it is common to use only the rectilinear connections as illustrated by the wire 20. Therefore, all distances are measured using rectilinear or Manhattan distance method.

For simplicity, the chip 8 of FIG. 1 shows only a few columns; however, in a practical implementation, it is common for a chip to have many hundreds of columns and channels, and hundreds of thousands of cells and about the same number of nets.

The channels of a chip are commonly used to run vertical wires for the chip. To run horizontal wires, another layer of material is fabricated on the surface of the chip. Via's are used to bring the pins up to the second layer for the horizontal connections. If the surface area is at premium, another, layer of material may be fabricated on top of the horizontal-wire layer. This third layer may be used to run the vertical wires and the width of the channels may be reduced to decrease the overall surface area requirement.

Because there are a large number of pins to connect and the complex nature of the connections required, a proper placement of the cells and the routing of the wires are critical for a successful implementation of a chip. Some placement and routing schemes may result in uneven distribution of cells and wires leading to congestion in some areas of the chip while other areas of the chip may be sparsely used.

After placement of the cells on the chip's surface, wire routing congestion must be analyzed. To determine the congestion levels, a common method has been to actually determine the routing of the wires for the chip. However, the routing process is very costly in computational time, and for mere finding of congested areas, not necessary.

SUMMARY OF THE INVENTION

Therefore, an object of the present invention is to provide for a method and apparatus to quickly find a good global routing estimation on a chip. The method and apparatus disclosed herein quickly estimates the routing of wires, or edges, of an IC.

The present invention provides a method of determining the edges of wire routing of a net having pins. First, the a grid is defined. Second, connected-pin-sets (c-p-sets) are defined. Finally, the c-p-sets are connected and merged until only one c-p-set is remaining. The c-p-sets are connected and merged by connecting and merging two closest c-p-sets and repeating the process until only one c-p-set remains. Each of the connections are the edges. A c-p-set has a group of pins or Steiner pins.

The present invention also provides for an integrated circuit chip (IC) having been built using the quick routing method of the present invention.

The present invention also provides for an apparatus for determining the edges for routing a set of pins. The apparatus includes a processor which reads in a net, connects it to determine the edges, and writes a set of edges. To connect the net, the processor defines a grid and c-p-sets. The c-p-sets are connected and merged, two at a time, until a single c-p-set remains. The instructions for the processor is stored in memory, connected to the processor. The memory may be any machine-readable storage medium containing the instructions for the processor to perform the above-discussed steps.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 4 is a block diagram illustrating an apparatus according to a preferred embodiment of the present invention.

DETAILED DESCRIPTION OF THE PREFERRED EMBODIMENT(S)

As discussed above, the present invention provides for a method of quickly determining a good global routing estimation on a chip. This is performed by finding a good estimation of the minimal routing of the wires for each of the nets of the netlist for a chip. For simplicity, this specification will illustrate routing of a net containing six (6) pins. The illustrated steps contained herein is to be repeated for each of the nets of the netlist.

Figure 3A:
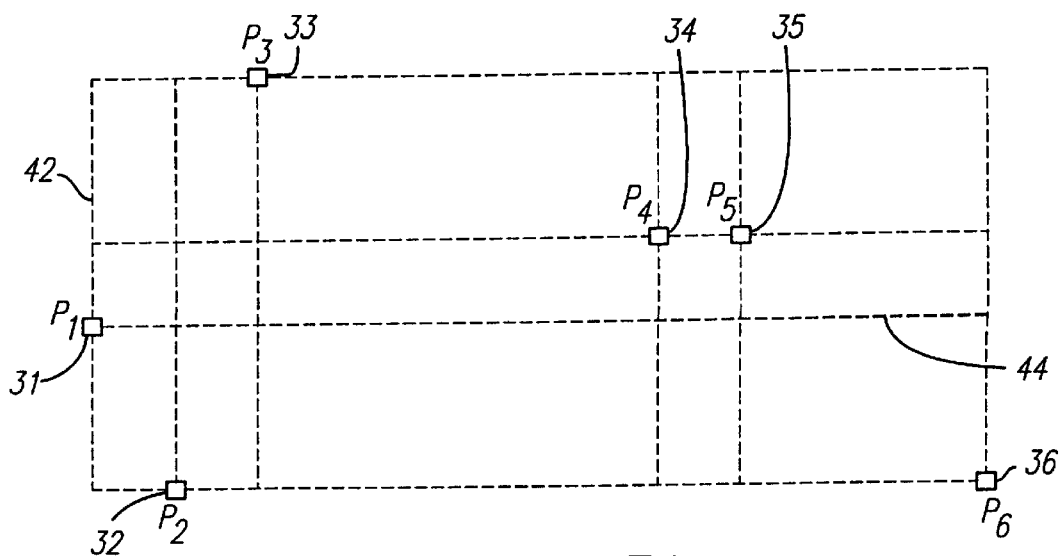
FIG. 3A is a diagram illustrating a sample set of pins, or a sample net.

FIG. 3A illustrates a sample net having pins $P_1$ through $P_6$ where the location of each of the pins is defined by the net. The invention as disclosed herein determines the connection, or the edges, of the net where each edge is defined by its end points. Each end point is a pin or a pseudo-pin. A pseudo-pin is also referred to as a Steiner pin or a Steiner point and will be further discussed below.

Figure 1:
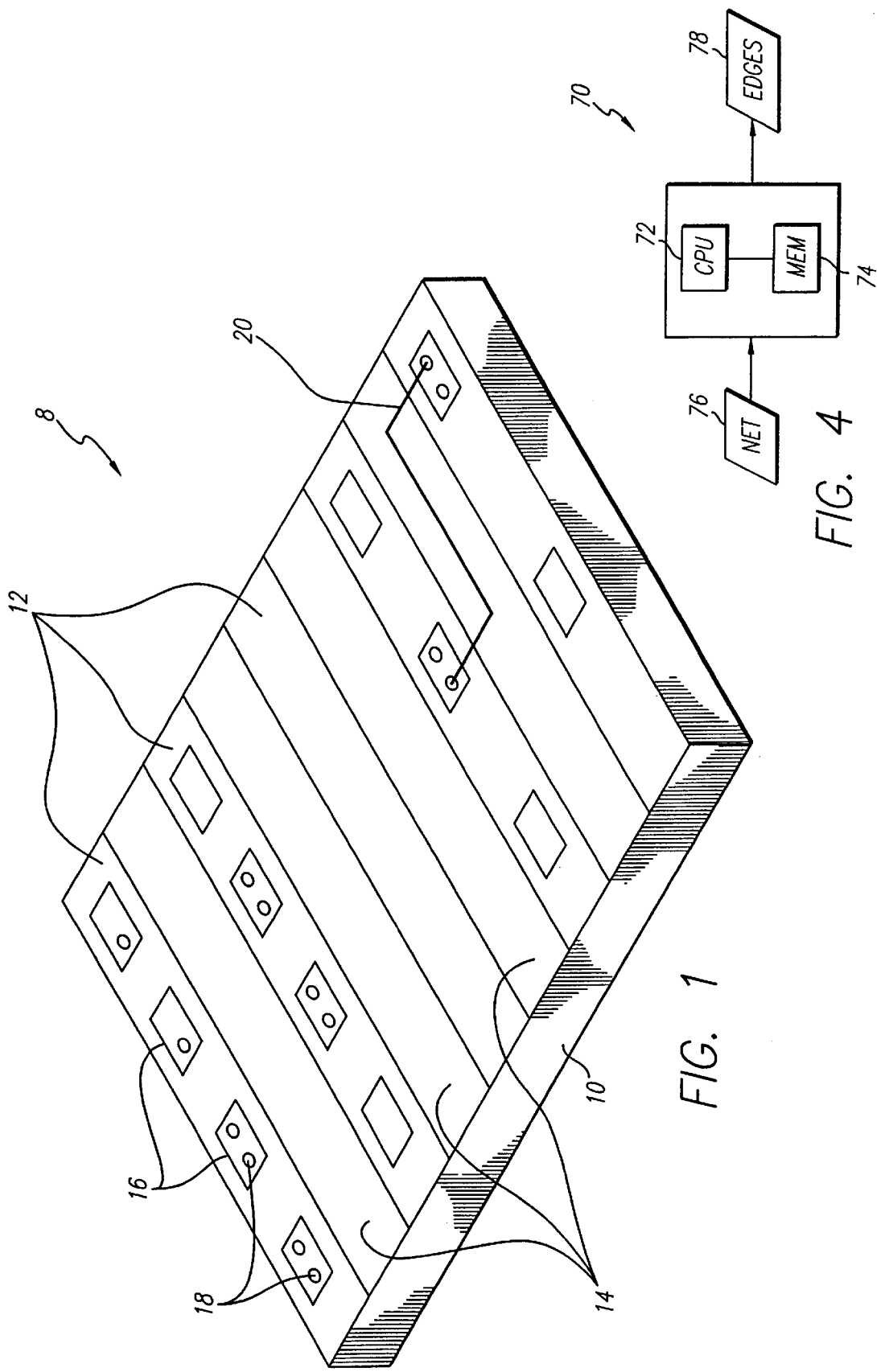
FIG. 1 is a simplified illustrating of an integrated circuit chip on a semiconducting material.
Figure 2:
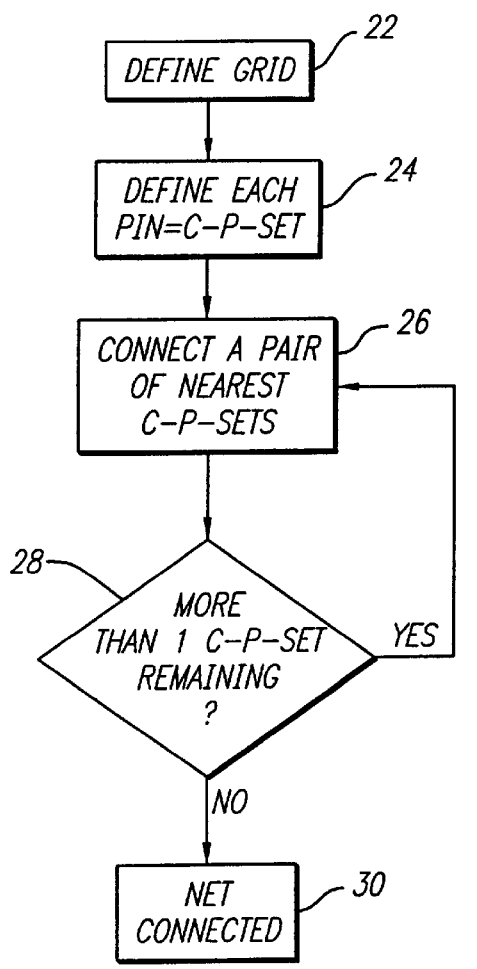
FIG. 2 is a flowchart illustrating the steps of the present invention.

Referring to FIG. 2, a flowchart illustrating the present invention is shown. The flowchart will be illustrated using a sample net as illustrated by FIGS. 3A, 3B, 3C, and 3D. As FIG. 3A shows, a sample set of six pins are illustrated. For the purposes of illustrating the present invention, the pins of the sample net will be assigned the following coordinates:

| | | |
|---|---|---|
| $P_1$ | (0, 2) | reference number 31 |
| $P_2$ | (1, 0) | reference number 32 |
| $P_3$ | (2, 5) | reference number 33 |
| $P_4$ | (7, 3) | reference number 34 |
| $P_5$ | (8, 3) | reference number 35 |
| $P_6$ | (11, 0) | reference number 36 |

The first step 22 of the method of the present invention is to define a grid by drawing vertical and horizontal lines through each of the pins of the net. The grid lines are not actually "drawn" but merely defined for the purposes of implementing the present invention. FIG. 3A shows the grid lines as dotted lines. For instance, line 42 is the vertical line through point $P_1$ and line 44 is the horizontal line through $P_1$. Only the nodes of the grid lines are the candidates for the Steiner points.

Thus, the sample net is a set of the following pins:

net=set of pins=$\{P_1, P_2, P_3, P_4, P_5, P_6\}$

In the beginning, there are not edges defined, thus the set of edges are:

edges=set of edges={ }

For the purposes of implementing the present invention, a set of connected pins, referred to as a c-p-set (for Connected-Pin-Set) is maintained. Initially, the c-p-set is empty as follows:

c-p-sets=set of connected pins={ }

The second step 24 of the present invention is to define each pin of the net as a c-p-set having one pin as its member. After this operation, the sets are as follows:

c-p-sets=$\{P_1\}$ $\{P_2\}$ $\{P_3\}$ $\{P_4\}$ $\{P_5\}$ $\{P_6\}$ edges={ }

The third step 26 of the present invention is to connect the two closest c-p-sets. The determination of the closest c-p-sets are made by determining the distances between all pairs of c-p-sets of the net and selecting the pair having the minimal distance. Distance between any two c-p-sets is defined as the smaller distance between a pin, Steiner pin, or a Steiner pin candidate of the first c-p-set to a pin, Steiner pin, or a Steiner pin candidate of the second c-p-set. For the present example, the rectilinear distances between all pairs of c-p-sets are:

| | | |
|---|---|---|
| $\{P_1\}$ and $\{P_2\}$ | 3 | units |
| $\{P_1\}$ and $\{P_3\}$ | 5 | units |
| $\{P_1\}$ and $\{P_4\}$ | 8 | units |
| $\{P_1\}$ and $\{P_5\}$ | 9 | units |
| $\{P_1\}$ and $\{P_6\}$ | 13 | units |
| $\{P_2\}$ and $\{P_3\}$ | 6 | units |
| $\{P_2\}$ and $\{P_4\}$ | 9 | units |
| $\{P_2\}$ and $\{P_5\}$ | 10 | units |
| $\{P_2\}$ and $\{P_6\}$ | 10 | units |
| $\{P_3\}$ and $\{P_4\}$ | 7 | units |
| $\{P_3\}$ and $\{P_5\}$ | 8 | units |
| $\{P_3\}$ and $\{P_6\}$ | 14 | units |
| $\{P_4\}$ and $\{P_5\}$ | 1 | unit |
| $\{P_4\}$ and $\{P_6\}$ | 7 | units |
| $\{P_5\}$ and $\{P_6\}$ | 6 | units |

Therefore, for the first connection operation, points $P_4$ and $P_5$ are selected because these two pins are closest to each other.

Figure 3B:
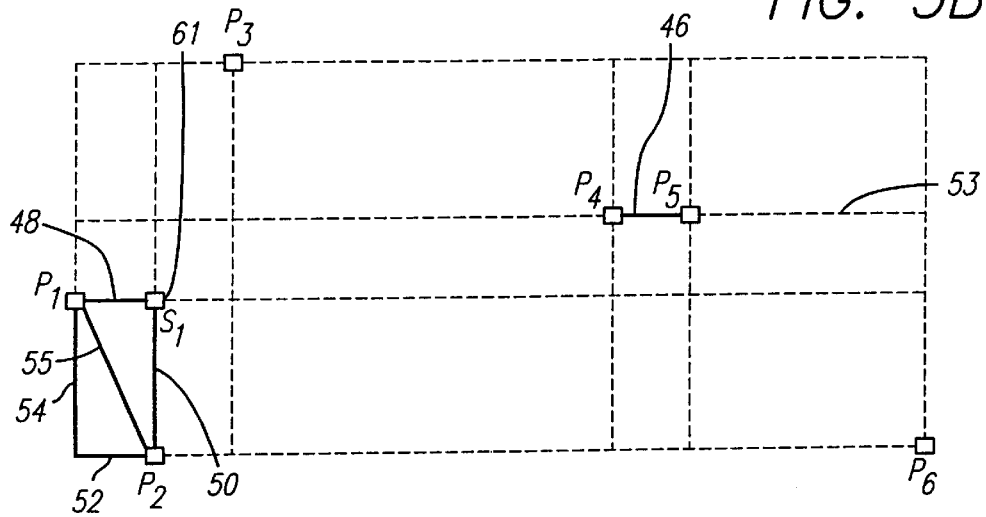
FIG. 3B is a diagram illustrating the sample net having two edges.

Then, the points are connected 26 by defining an edge between the points and merging the two c-p-sets into a single c-p-set. After the operation, the sets are as follows:

c-p-sets=$\{P_1\}$ $\{P_2\}$ $\{P_3\}$ $\{P_4$-$P_5\}$ $\{P_6\}$ edges=$\{P_4$-$P_5\}$ The resulting line 46 of FIG. 3B represent the connection $P_4$-$P_5$. The above-described operation of finding the nearest pair of c-p-sets and connecting them are repeated until only one c-p-set remains.

For instance, after the first operation described above, the distances between the c-p-sets of the sample net are:

| | | |
|---|---|---|
| $\{P_1\}$ and $\{P_2\}$ | 3 | units |
| $\{P_1\}$ and $\{P_3\}$ | 5 | units |
| $\{P_1\}$ and $\{P_4 - P_5\}$ | 8 | units between $P_1$ and $P_4$ |
| $\{P_1\}$ and $\{P_6\}$ | 13 | units |
| $\{P_2\}$ and $\{P_3\}$ | 6 | units |
| $\{P_2\}$ and $\{P_4 - P_5\}$ | 9 | units between $P_2$ and $P_4$ |
| $\{P_2\}$ and $\{P_6\}$ | 10 | units |
| $\{P_3\}$ and $\{P_4 - P_5\}$ | 7 | units between $P_3$ and $P_4$ |
| $\{P_3\}$ and $\{P_6\}$ | 14 | units |
| $\{P_4 - P_5\}$ and $\{P_6\}$ | 6 | units between $P_5$ and $P_6$ |

Therefore, the next operation is to connect $\{P_1\}$ and $\{P_2\}$. Because c-p-sets $\{P_1\}$ and $\{P_2\}$ do not share a common grid line, as illustrated by FIG. 3, the edge between the c-p-sets is defined by a superedge comprising segments 48, 50, 52, and 54. For simplicity, a superedge will be referred to using a diagonal segment such as segment 55 connecting the c-p-sets. The operation results in the following sets:

c-p-sets=$\{P_1$-$P_2\}$ $\{P_3\}$ $\{P_4$-$P_5\}$ $\{P_6\}$ edges=$\{P_1$-$P_2, P_4$-$P_5\}$ A superedge is a minimal bounding box containing the connected pins all of which are not located on a single grid line. For example, the line 46, connecting c-p-sets $\{P_4\}$ and $\{P_5\}$ are "normal" edges because they share the grid line 53.

The next iteration of the operation results in the following distances:

| | | |
|---|---|---|
| $\{P_1 - P_2\}$ and $\{P_3\}$ | 4 | units between Steiner pin candidate $S_1$ 61 and $P_3$ |
| $\{P_1 - P_2\}$ and $\{P_4 - P_5\}$ | 7 | units between Steiner pin candidate $S_1$ 61 and $P_3$ |
| $\{P_1 - P_2\}$ and $\{P_6\}$ | 10 | units between $P_2$ and $P_6$ |
| $\{P_3\}$ and $\{P_4 - P_5\}$ | 7 | units between $P_3$ and $P_4$ |

-continued

| | |
|---|---|
| {P₃} and {P₆} | 14 units |
| {P₄ – P₅} and {P₆} | 6 units between P₅ and P₆ |

Note that the distance between $\{P_1\text{-}P_2\}$ and $\{P_3\}$ is the distance between $\{P_3\}$ and the closest point of the superedge of $\{P_1\text{-}P_2\}$ c-p-set which is between $\{P_3\}$ and a Steiner point $S_1$ 56. Because the $\{P_1\text{-}P_2\}$ edge did not include a common grid line, a Steiner point was created during the calculation to determine the nearest point between the c-p-sets $\{P_1\text{-}P_2\}$ and $\{P_3\}$.

After the operation, the sets are:

c-p-sets=$\{P_1\text{-}P_2\text{-}S_1\text{-}P_3\}$ $\{P_4\text{-}P_5\}$ $\{P_6\}$ edges=$\{P_1\text{-}S_1, P_2\text{-}S_1, S_1\text{-}P_3, P_4\text{-}P_5\}$ After defining the Steiner pin $S_1$, the superedge $P_1\text{-}P_2$ becomes two normal edges $P_1\text{-}S_1$ and $P_2\text{-}S_1$. The newly defined superedge is $P_3\text{-}S_1$, being defined by a diagonal segment 57.

For the next iteration, the following distances are in effect:

| | |
|---|---|
| $\{P_1 - P_2 - S_1 - P_3\}$ and $\{P_4 - P_5\}$ | 5 units between the Steiner pin candidate $S_2$ 62 and $P_6$ |
| $\{P_1 - P_2 - S_1 - P_3\}$ and $\{P_6\}$ | 10 units between the $P_2$ and $P_6$ |
| $\{P_4 - P_5\}$ and $\{P_6\}$ | 6 units between $P_5$ and $P_6$. |

Figure 3C:
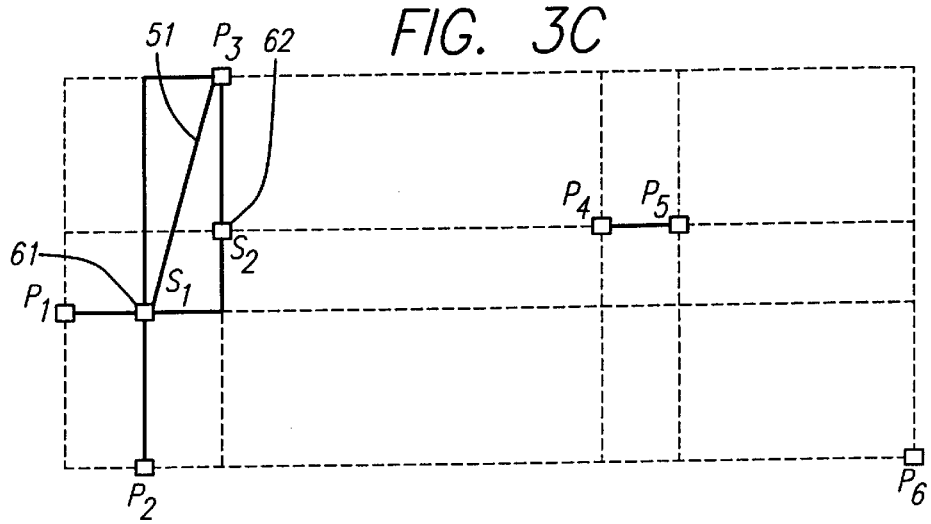
FIG. 3C is a diagram illustrating the sample net having three edges.
Figure 3D:
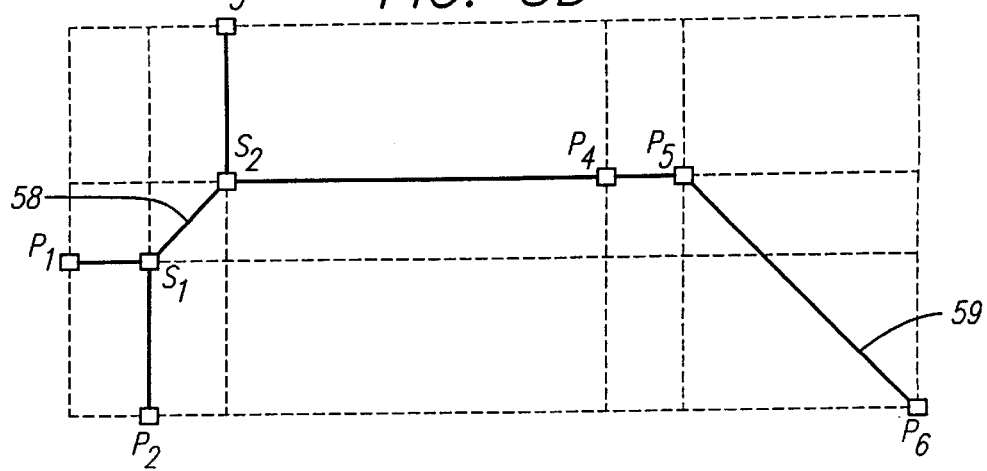
FIG. 3D is a diagram illustrating the sample net with a complete connected-pin-set.

Next, the c-p-sets$\{P_1\text{-}P_2\text{-}S_1\text{-}P_3\}$ and $\{P_4\text{-}P_5\}$ are connected because the distance between these c-p-sets are smaller than any other pair of c-p-sets. After the connection, the following are the set configurations (as illustrated in FIG. 3C):

c-p-sets=$\{P_1\text{-}P_2\text{-}S_1\text{-}P_3\text{-}S_2\text{-}P_4\text{-}P_5\}$ $\{P_6\}$ edges=$\{P_1\text{-}S_1, P_2\text{-}S_1, S_1\text{-}S_2, S_2\text{-}P_3, S_2\text{-}P_4, P_4\text{-}P_5\}$ Finally the remaining c-p-sets, $\{P_1\text{-}P_2\text{-}S_1\text{-}P_3\text{-}S_2\text{-}P_4\text{-}P_5\}$ and $\{P_6\}$ are connected and merged to form a single set: $\{P_1\text{-}P_2\text{-}S_1\text{-}P_3\text{-}S_2\text{-}P_4\text{-}P_5\text{-}P_6\}$ with $S_1\text{-}S_2$ and $P_5\text{-}P_6$ remaining a superedges as illustrated by FIG. 3D and segments. The final resultant set of edges is:

edges=$\{P_1\text{-}S_1, P_2\text{-}S_1, S_1\text{-}S_2, S_2\text{-}P_3, S_2\text{-}P_4, P_4\text{-}P_5, P_5\text{-}P_6\}$ Referring again to FIG. 2, the steps of the present invention as outlined by the flowchart of FIG. 2 can be computationally expensive if the number of pins of the net is large. In fact, experiences have shown that, at present time using current technology, a preferred maximum number of pins should not exceed fifteen (15) for efficient routing. If the number of pins of the net to be routed is greater than 15, then the net should be grouped into subsets of 15 or more, each subset routed, and the original set routed, using iterative application of the present process, by connecting the subsets.

That is, any number of pins can be efficiently routed by grouping the pins into subsets, each subset containing less then a predetermined number of pins. If the number of subsets to be routed is greater than 15, then the technique can be iteratively applied.

Now referring to FIG. 4, a computing apparatus 70 for determining the wire routing for a set of pins is illustrated. The apparatus comprises a processor 72 and memory 74. The memory 74 stores instructions for the processor 72 for the processor 72 to read in a net 76 and connect the pins of the net as described in detail by FIGS. 2, 3A, 3B, 3C, and 3D and the corresponding discussions expressed hereinabove. After the connections are made, the processor then writes the edge set 78 listing the edges and also listing the Steiner points.

The memory may be any kind of machine-readable storage medium containing the instructions for the processor to read a net, route the pins, and write an edgelist. It is well known in the art that the memory may be formed as a semiconductor memory device, magnetic device, optical device, magneto-optical device, floppy diskette, hard drive, CD-ROM, magnetic tape, computer memory, or memory card.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A method of determining the edges for routing of wires for a net having pins, said method comprising the steps of:
   a. defining a grid;
   b. defining each pin of the net as a set of connected pins (c-p-set);
   c. identifying a pair of c-p-sets being closer to each other than any other pair of c-p-sets of the net;
   d. connecting said pair of c-p-sets so as to form a single c-p-set; and
   e. repeating steps c to d until one c-p-set remains.

2. A method according to claim 1 wherein said grid is defined by drawing horizontal and vertical lines through each of the pins of the net.

3. A method according to claim 1 wherein said step of connecting said pair of c-p-sets further comprise merging of said pair of c-p-sets.

4. A method according to claim 1 wherein said step of identifying a pair of closest c-p-sets comprises the steps of:
   determining distance between all pairs of c-p-sets of the net; and
   selecting a pair of c-p-sets having smallest distance between them.

5. A method according to claim 4 wherein said distance between two c-p-sets is the smaller distance between a pin, a Steiner pin, or a Steiner pin candidate of one of said pair c-p-set to a pin, Steiner pin, or a Steiner pin candidate of the other of said pair of c-p-set.

6. A method according to claim 4 wherein said distance is rectilinear distance.

7. A method according to claim 1 wherein said step of connecting said pair of c-p-sets comprises the steps of:
   defining a superedge for each of said pair of c-p-sets;
   defining Steiner pins, if necessary, for each of said pair of c-p-sets;
   connecting a first pin, a member of the first c-p-set of said pair, to a second pin, a member of the second c-p-set of said pair; and
   defining a single c-p-set comprising pins of both said pairs of c-p-sets including Steiner pins.

8. A method according to claim 1 farther comprising a step of maintaining an edgelist.

9. A method according to claim 8 wherein said edgelist comprises a sets of edges.

10. A method according to claim 9 wherein an edge, a member of a set of edges, is defined by a pair of end pins wherein an end pin may be a pin or a Steiner pin.

11. A method according to claim 1 further comprising the steps of:
   grouping the pins of the net into groups of a predetermined number of pins prior to defining the grid;
   applying the steps a through e for each group; and
   applying the steps a through e for the net using the group as the c-p-set.

12. A method according to claim 11 her comprising the step of applying the steps of claim 11 iteratively for multiple levels of groups.

13. A method according to claim 11 wherein said predetermined number of pins is 15.

14. An integrated circuit chip (IC) having pins optimally routed, said optimal routing method comprising the steps of:
   a. defining a grid;
   b. defining each pin of the net as a set of connected pins (c-p-set);
   c. identifying a pair of c-p-sets being closer to each other than any other pair of c-p-sets of the net;
   d. connecting said pair of c-p-sets so as to form a single c-p-set; and
   e. repeating steps c to d until one c-p-set remains.

15. An apparatus for determining the edges for routing a set of pins, said apparatus comprising:
   a processor;
   a memory connected to said processor;
   said memory having instructions for said processor to
   a. define a grid for the pins;
   b. define each pin as a set of connected pins (c-p-set);
   c. identify a pair of c-p-sets being closer to each other than any other pair of c-p-sets of the set of pins;
   d. connect said pair of c-p-sets so as to form a single c-p-set; and
   e. repeat steps c to d until one c-p-set remains.

16. An apparatus according to claim 15 wherein said memory further comprises instructions to read a net definition and to maintain an edgelist.

17. A machine-readable storage medium containing instructions for a processor, said instructions comprising the steps for the processor to:
   a. read a net;
   b. define a grid for the pins of said net;
   c. define each pin as a set of connected pins (c-p-set);
   d. identify a pair of c-p-sets being closer to each other than any other pair of c-p-sets of the set of pins;
   e. connect said pair of c-p-sets so as to form a single c-p-set; and
   f. repeat steps c to e until one c-p-set remains.

18. A storage medium according to claim 17 wherein said storage medium is selected from a group consisting of semiconductor memory device, magnetic device, optical device, magneto-optical device, floppy diskette, hard drive, CD-ROM, magnetic tape, computer memory, and memory card.

* * * * *